United States Patent [19]
Boitnott et al.

[11] Patent Number: 5,914,278
[45] Date of Patent: Jun. 22, 1999

[54] BACKSIDE ETCH PROCESS CHAMBER AND METHOD

[75] Inventors: Charles A. Boitnott, Half Moon Bay; Robert A. Shepherd, Jr., Castro Valley, both of Calif.

[73] Assignee: Gasonics International, San Jose, Calif.

[21] Appl. No.: 08/788,601

[22] Filed: Jan. 23, 1997

[51] Int. Cl.⁶ .................................................. H01L 21/00
[52] U.S. Cl. .......................... 438/724; 156/345; 216/69; 438/726; 438/744
[58] Field of Search .................... 216/58, 67; 156/345 V, 156/345 P, 345 PC, 345 WH, 345 PW, 345 MC; 438/706, 710, 724, 744, 726, 727

[56] References Cited

U.S. PATENT DOCUMENTS

| | | | |
|---|---|---|---|
| 4,512,283 | 4/1985 | Bonifield et al. | 156/345 X |
| 5,213,650 | 5/1993 | Wang et al. | 156/345 |
| 5,753,566 | 5/1998 | Hwang | 216/67 X |

*Primary Examiner*—William Powell
*Attorney, Agent, or Firm*—Thomas E. Schatzel; Law Offices of Thomas E. Schatzel A Prof. Corporation

[57] ABSTRACT

A modular semiconductor wafer processing system comprises a chamber with a wafer support and gas manifold structure that supplies reactive gases through a showerhead delivery system to one side of a wafer-being-processed and that exhausts both the reactive gases and a non-reactive gas flow. The other side of the wafer is protected from the reactive gases by evenly delivering the non-reactive gases from a platen close to the wafer. The gap between the wafer and platen, and the choice of non-reactive gas and its flow rate are adjusted to optimize the protection afforded to the wafer's one side while still allowing, for example, the stripping of a silicon nitride film from the wafer's other side.

11 Claims, 3 Drawing Sheets

BACKSIDE ETCH PROCESS CHAMBER AND METHOD

BACKGROUND OF THE INVENTION

1. Field of the Invention

The invention relates generally to semiconductor processing equipment and more particularly to devices and methods for etching one side of a semiconductor wafer while protecting the other side of the wafer from reactive gases.

2. Description of the Prior Art

Silicon nitride and other films are commonly applied to semiconductor wafers during process fabrication. Such films after they have served their purpose are removed so that the next process step may be done. For example, silicon wafers can be selectively patterned with oxide structures by coating the wafer with silicon nitride, applying a photoresist to the silicon nitride, and patterning the photoresist so that holes in the silicon nitride can be opened up. The remaining nitride is then used as a mask for subsequent oxidation of the exposed areas of silicon. After the oxide is grown the remaining silicon nitride mask is removed or cleaned.

In conventional processes, the frontside of the wafer must be cleaned while upright and then turned over to clean the backside. Extra steps are needed to protect the structures being fabricated on the frontside while the backside is being stripped of silicon nitride. Prior art systems strip the silicon nitride or other film from the frontside of the wafer and then deposit a photoresist to protect the frontside. The wafer is then turned over, and the silicon nitride is removed, e.g., by a reactive gas flow. The wafer is then ashed to remove the photoresist on the frontside.

Such prior art methods are labor intensive and not very conducive to high volume production with cluster processing equipment, such as the UNO marketed by Gasonics, Inc. (San Jose, Calif.). What is needed are devices and methods that can eliminate the wafer turning and the extra steps of depositing and ashing films to protect the wafer frontside from cleaning operations directed at the wafer backside.

SUMMARY OF THE PRESENT INVENTION

It is therefore an object of the present invention to provide a method and system that allows for total processing in a single platform in one pass without requiring a separate step to protect the front side of the processed wafer in a subsequent step.

It is another object of the present invention to provide a method and system for cleaning the backside of a semiconductor wafer while protecting the wafer's frontside.

It is a further object of the present invention to provide a method and a system compatible with modular multiple chamber semiconductor processing systems.

It is another object of the present invention to provide a method and system for cleaning the backside of a semiconductor wafer and for protecting the wafer's frontside without necessitating the turning over of the wafer.

Briefly, a modular semiconductor wafer processing system embodiment of the present invention comprises a chamber with a wafer support and gas manifold structure that supplies reactive gases through a showerhead delivery system under a wafer-being-processed and that exhausts both the reactive gases and a non-reactive gas flow out the top. The top or frontside of the wafer is protected from the reactive gases by evenly delivering the non-reactive gases from a platen above the wafer. The gap between the wafer and platen, and the choice of non-reactive gas and its flow rate are adjusted to optimize the protection afforded to the wafer frontside while still allowing, for example, the stripping of a silicon nitride film from the wafer backside.

An advantage of the present invention is a method and system are provided for cleaning the backside of a semiconductor wafer while protecting the wafer's frontside. This geometry can be inverted to provide cleaning the frontside while protecting the backside.

Another advantage of the present invention is that a method and system are provided to support wafer processing systems with high manufacturing throughputs.

A further advantage of the present invention is that a wafer processing system is provided that is flexible and provides high quality wafer processing.

Another advantage of the present invention is that a modular wafer process system is provided that allows mechanical interchangeability between each of several processing ports in the lid of a circular vacuum chamber.

These and other objects and advantages of the present invention will no doubt become obvious to those of ordinary skill in the art after having read the following detailed description of the preferred embodiment which is illustrated in the drawing figures.

IN THE DRAWINGS

DETAILED DESCRIPTION OF THE PREFERRED EMBODIMENTS

Figure 1:
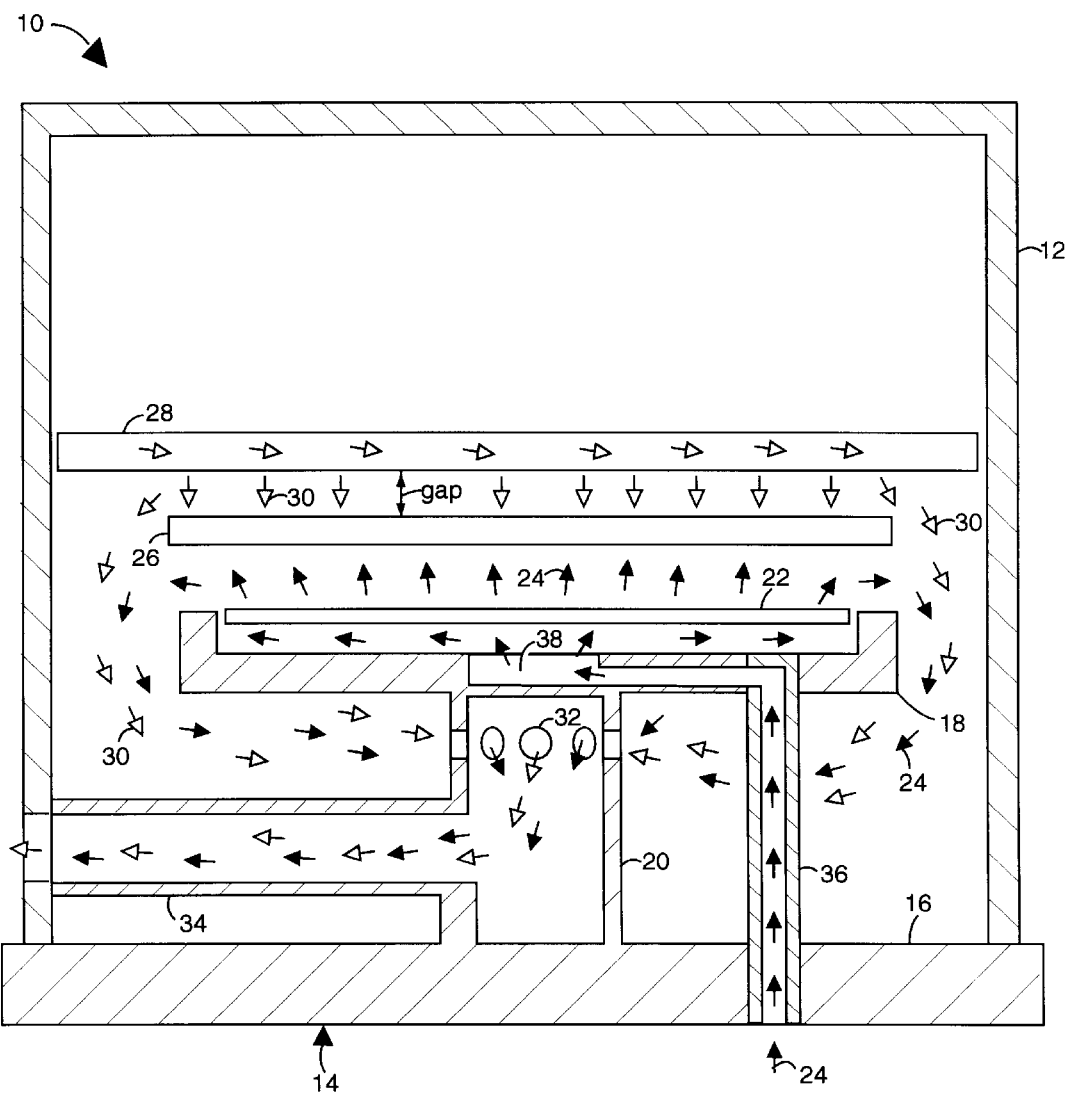
FIG. 1 is a cross sectional diagram of a proof-of-concept modular wafer processing system embodiment of the present invention.

FIG. 1 illustrates a proof-of-concept modular wafer processing system embodiment of the present invention, referred to herein by the general reference numeral 10. Such was used as a research and development test stand to arrive at the production version illustrated in FIG. 3. The system 10 comprises a chamber wall 12 that contains a vacuum. A support and gas manifold structure 14 has a bottom plate 16 and an upper tray 18 separated by a central exhaust stem 20. A perforated lid 22 passes through a reactive gas 24 that operates on the backside (bottom in FIG. 1) surface of a semiconductor wafer 26. For example, gases that will remove silicon nitride from a silicon wafer are used, and such gases and their process applications are well-known in the art.

Conventional mechanisms, e.g., pin lifters, can be used to hold the wafer 26 aloft from the lid 22 and stops can be used to set a critical distance ("gap") between the wafer 26 and a non-reactive gas supply system 28. An inert gas 30 is used as a shield gas to protect the frontside (top in FIG. 1) surface of the wafer 26 from the effects of the reactive gas 24. For example, argon may be used as a shield gas 30. The type of gas 30, the pressure of its delivery by the non-reactive gas supply system 28, and the gap between the wafer 26 and a non-reactive gas supply system 28 are critically balanced to afford the frontside of the wafer 26 a degree of protection adequate for protecting the delicate structures being fabricated in the process flow on the wafer frontside. Once the gases 24 and 30 have flooded their corresponding sides of the wafer 26, they are drawn out together through a system of ports 32 on the central stem 20, and then out through an exhaust pipe 34. A reactive gas supply stem 36 delivers fresh supplies of the reactive gas 24 to a hub well 38 under the lid 22. The proof of concept system 10 is such that the wafer is inverted compared to t:he preferred configuration, e.g., the reactive flow is from the top, wherein gas flow 30 is reactive and gas flow 24 is inert. So, nitride may be removed from the top side while the bottom is protected. In preferred embodiments of the present invention, the reactive gas flow 30 is delivered to the wafer from the bottomside.

Figure 2:
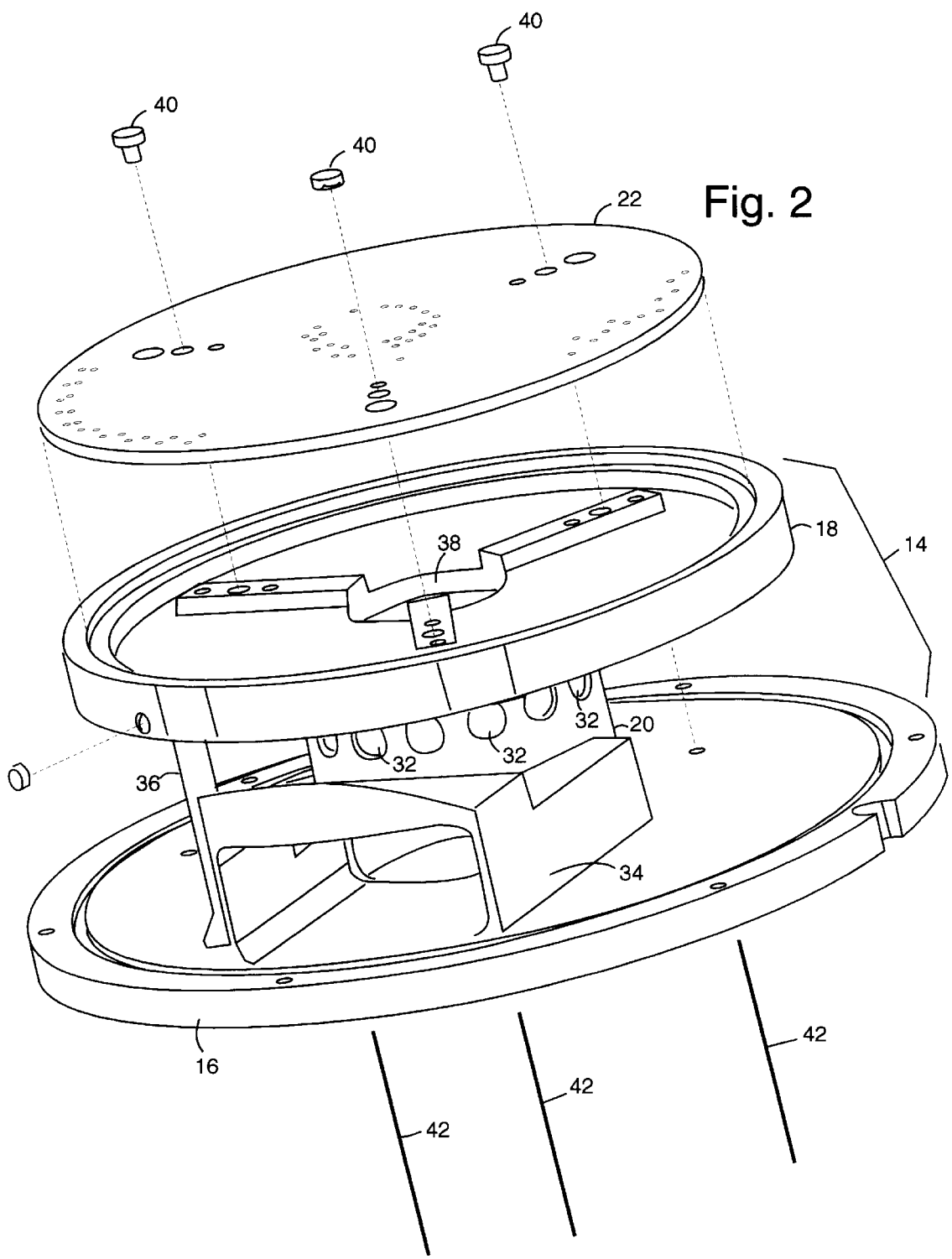
FIG. 2 is a perspective diagram of the support and gas manifold structure and the lid of the proof-of-concept wafer processing system of FIG. 1.

FIG. 2 illustrates the details of the support and gas manifold structure 14 and the lid 22 of the wafer processing system 10 of FIG. 1. A set of three stops 40 limit how far the wafer 26 can drop toward the lid 22. Different thicknesses of stops 40 can be used to adjust the critical gap between the wafer 26 and the non-reactive gas supply system 28. A set of pin lifters 42 penetrate the support and gas manifold structure 14 and the lid 22, and are pushed in deeper to lift the wafer 26 up away from the lid 22 and stops 40, e.g., to enable a shuttle to carry the wafer 26 to a next processing station in a cluster. The lid 22 has perforations in it that allow for the even passage of gas through the lid, e.g., as in a showerhead. In an alternative embodiment, the support and gas manifold structure 14 is shaped, as in FIG. 2, to provide a bolt-in assembly that can be swapped in and out of various processing stations of a cluster processor.

A typical modular semiconductor wafer processing system is preferably configured to allow a chamber with a wafer support and gas manifold structure to supply reactive gases from beneath through to a showerhead delivery system. A wafer-being-processed is scrubbed by the gas that then exhausts with the non-reactive gas flow. The top or frontside of the wafer is preferably protected from the reactive gases by evenly delivering the non-reactive gases from a platen above the wafer. The gap between the wafer and platen, and the choice of non-reactive gas and its flow rate are adjusted to optimize the protection afforded to the wafer frontside while still allowing, for example, the stripping of a silicon nitride film from the wafer backside.

A method of the present invention includes placing the semiconductor wafer 26 in the reactive gas flow 24 on a first side and the non-reactive gas flow 30 on a second side. The non-reactive gas flow 30 is primarily used to shield structures being fabricated on the second side of the wafer 26 from the reactive gas flow 24, e.g., to avoid the extra processing steps and turning over of the wafer to apply and then remove a protective film. The type of gas 30, the pressure of its delivery by the non-reactive gas supply system 28, and the gap between the wafer 26 and a non-reactive gas supply system 28 are balanced before processing to allow the reactive gas 24 to do its job without ruining the structures already fabricated on the wafer 26. The wafer 26 is not inverted from its orientation in any preceding process station to apply the reactive gas 24, so re-inversion is not required for subsequent processing stations.

Figure 3:
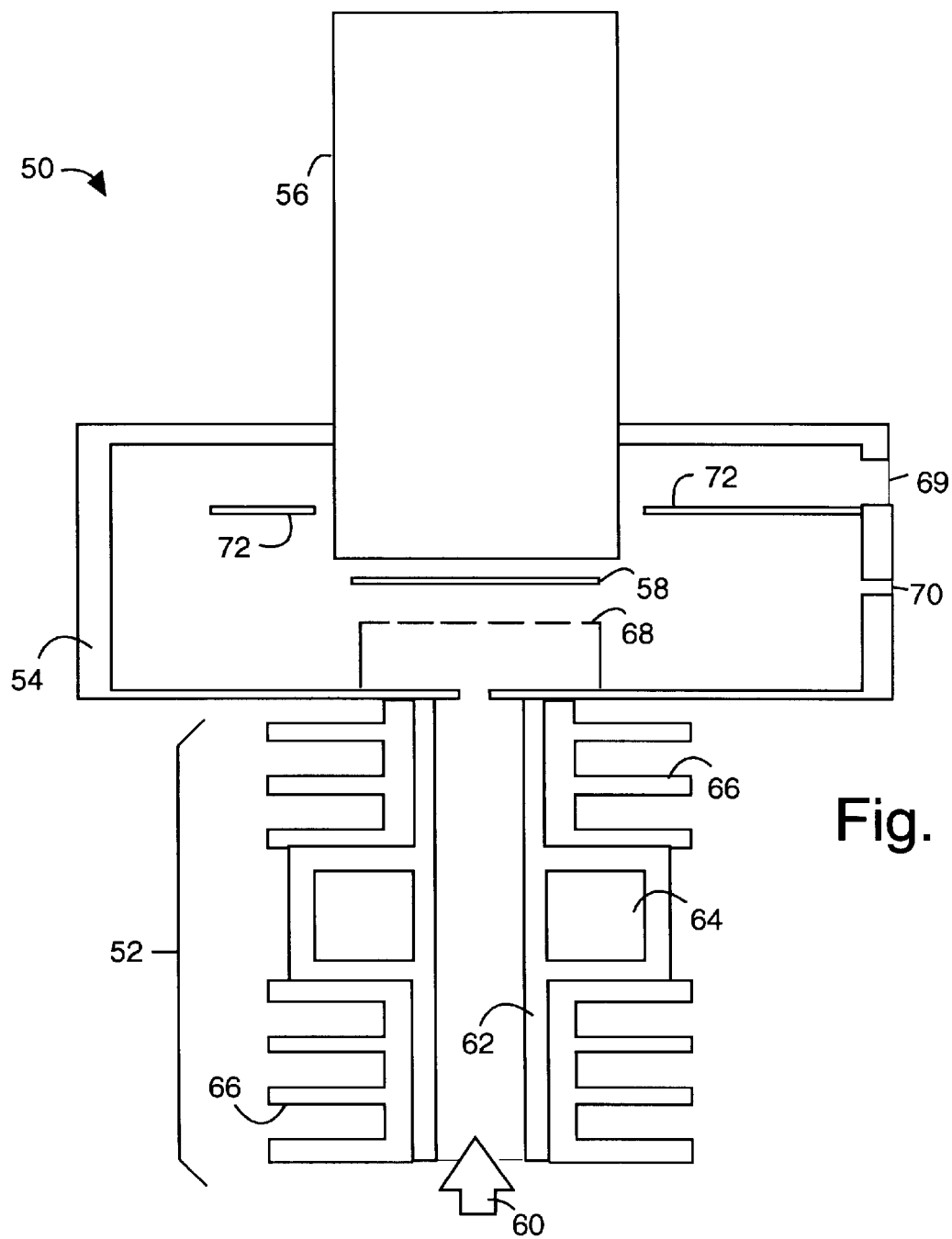
FIG. 3 is a schematic diagram of production version of a backside etch process chamber and modular wafer processing system embodiment of the present invention.

FIG. 3 represents a backside etch process chamber and modular wafer processing system embodiment of the present invention, referred to herein by the general reference numeral 50. A waveguide and cooling assembly 52 is mounted to the bottom of a wafer processing chamber 54. An interchangeable process module 56 is attached to the top and thereby gives access to the frontside of a wafer 58. A gas is introduced into a plasma, tube 62 for microwave heating provided by a 2.45 GHz wave guide 64. While water cooling is most often preferred, a number of radial fins 66 can be included for air cooling. A gas distribution plenum 68 provides for a showerhead distribution of heated reactive gases intended to etch only the backside of the wafer 58. A non-reactive gas flow is maintained above the wafer 58 to shield the frontside during etching operations on the backside. The gases are exhausted out through ports 69 and 70 on the sides and top. The gap between the wafer 58 and a platen 72, and the choice of non-reactive gas and its flow rate are adjusted to optimize the protection afforded to the wafer frontside while still allowing, for example, the stripping of a silicon nitride film from the wafer backside.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A modular wafer processing system, comprising:

a gas manifold disposed in a vacuum chamber and providing for delivery of a reactive gas to a first of two opposite sides of a semiconductor wafer;

a wafer support providing for a critical positioning of said semiconductor wafer in said vacuum chamber; and a non-reactive gas delivery system positioned to flood a second side of said semiconductor wafer with a shield gas;

wherein, a type of non-reactive gas used, the pressure of its delivery, and a gap between said wafer and the non-reactive gas delivery system are critically balanced to protect a delicate structure being fabricated in a process flow on said second side of said wafer.

2. The system of claim 1, further comprising:

a gas exhaust system disposed in the wafer support and gas manifold, and including a plurality of exhaust ports, and exhaust stem and an exhaust pipe connected to draw both said reactive and non-reactive gases off together on said first side of said wafer from an outside edge and out of said vacuum chamber.

3. The system of claim 1, further comprising:

a perforated lid positioned adjacent to said first side of said semiconductor wafer and within the wafer support and gas manifold and providing for a uniform flow of said reactive gases from a showerhead system of holes in a plane.

4. The system of claim 1, further comprising:

a reactive gas supply stem disposed within the wafer support and gas manifold and connected to provide a supply flow of said reactive gas from outside said vacuum chamber to an area adjacent to said first side of said semiconductor wafer.

5. The system of claim 1, further comprising:

a hub well disposed within the wafer support and gas manifold and positioned to provide a supply flow of said reactive gas to an area centered and adjacent to said first side of said semiconductor wafer.

6. The system of claim 1, further comprising:

a perforated lid positioned adjacent to said first side of said semiconductor wafer and within the wafer support and gas manifold and providing for a uniform flow of said reactive gases from a showerhead system of holes in a plane;

a reactive gas supply stem disposed within the wafer support and gas manifold and connected to provide a supply flow of said reactive gas from outside said vacuum chamber to an area adjacent to said first side of said semiconductor wafer; and a hub well disposed within the wafer support and gas manifold and positioned underneath the lid and connected to the reactive gas supply stem to provide a supply flow of said reactive gas to an area centered and adjacent to said first side of said semiconductor wafer.

7. The system of claim 6, further comprising:

a plurality of stops disposed on the surface of the lid that provide for a critical spacing between said second side of said semiconductor wafer and the non-reactive gas delivery system, wherein a balance of said critical spacing and a gas flow rate of said non-reactive gas is used to adjust a shielding effect of said non-reactive gas to said second side of said semiconductor wafer.

8. The system of claim 6, further comprising:

a plurality of pin lifters to support said semiconductor wafer and that provide for a critical spacing between said semiconductor wafer and the non-reactive gas delivery system.

9. The system of claim 1, further comprising:

a plurality of pin lifters that penetrate the wafer support and gas manifold and that allow the lifting of said semiconductor wafer up off the wafer support and gas manifold.

10. A modular wafer processing system, comprising:

a wafer support and gas manifold disposed in a vacuum chamber and providing for delivery of a reactive gas to a first of two opposite sides of a semiconductor wafer and further providing for a critical positioning of said semiconductor wafer in said vacuum chamber;

a non-reactive gas delivery system positioned to flood a second side of said semiconductor wafer with a shield gas;

a gas exhaust system disposed in the wafer support and gas manifold connected to draw both said reactive and non-reactive gases off an outside edge of said semiconductor wafer and out of said vacuum chamber;

a perforated lid positioned adjacent to said first side of said semiconductor wafer and within the wafer support and gets manifold and providing for a uniform flow of said reactive gases from a showerhead system of holes generally distributed in a pattern;

a reactive gas supply stem disposed within the wafer support and gas manifold and connected to provide a supply flow of said reactive gas from outside said vacuum chamber to an area adjacent to said first side of said semiconductor wafer;

a hub well disposed within the wafer support and gas manifold and positioned underneath the lid and connected to the reactive gas supply stem to provide a supply flow of said reactive gas to an area centered and adjacent to said first side of said semiconductor wafer;

a plurality of stops disposed on the surface of the lid that provide for a critical spacing between said second side of said semiconductor wafer and the non-reactive gas delivery system, wherein a balance of said critical spacing and a gas pressure of said non-reactive gas is used to adjust a shielding effect of said non-reactive gas to said second side of said semiconductor wafer; and a plurality of pin lifters that penetrate the wafer support and gas manifold and that allow the lifting of said semiconductor wafer up off the wafer support and gas manifold;

wherein said shield gas is non-reactive and protects a structure-under-fabrication on said second side from chemical and physical attack by said reactive gas.

11. A method for semiconductor wafer processing:

flowing a non-reactive gas over a first side of a semiconductor wafer in a vacuum processing chamber;

flowing a reactive gas over a second side of said semiconductor wafer opposite to said first side; and drawing both said reactive and non-reactive eases together away from said first side of said semiconductor wafer through an exhaust system;

wherein said non-reactive gas shields said first side of said semiconductor from being operated on by said reactive gas.

* * * * *